United States Patent
Chen et al.

(10) Patent No.: US 9,770,649 B2
(45) Date of Patent: Sep. 26, 2017

(54) GAMING SYSTEM AND GESTURE MANIPULATION METHOD THEREOF

(71) Applicants: Tyng-Yow Chen, Taipei (TW); Hsin-An Yu, Taipei (TW)

(72) Inventors: Tyng-Yow Chen, Taipei (TW); Hsin-An Yu, Taipei (TW)

(*) Notice: Subject to any disclaimer, the term of this patent is extended or adjusted under 35 U.S.C. 154(b) by 703 days.

(21) Appl. No.: 14/153,081

(22) Filed: Jan. 13, 2014

(65) Prior Publication Data

US 2014/0213342 A1 Jul. 31, 2014

Related U.S. Application Data

(60) Provisional application No. 61/757,240, filed on Jan. 28, 2013.

(51) Int. Cl.
| | | |
|---|---|---|
| *G07F 17/32* | (2006.01) | |
| *A63F 13/40* | (2014.01) | |
| *G06F 3/01* | (2006.01) | |
| *H01L 43/08* | (2006.01) | |
| *H01L 27/22* | (2006.01) | |
| *G11C 11/16* | (2006.01) | |
| *H01L 43/10* | (2006.01) | |

(52) U.S. Cl.
CPC ............ *A63F 13/10* (2013.01); *G06F 3/017* (2013.01); *G07F 17/3204* (2013.01); *G07F 17/3293* (2013.01); *G11C 11/16* (2013.01); *G11C 11/1675* (2013.01); *H01L 27/228* (2013.01); *H01L 43/08* (2013.01); *H01L 43/10* (2013.01)

(58) Field of Classification Search
CPC .................................................... G06F 3/017
See application file for complete search history.

(56) References Cited

U.S. PATENT DOCUMENTS

| | | | |
|---|---|---|---|
| 7,081,882 B2* | 7/2006 | Sowden ............. | G06F 3/03547 345/156 |
| 8,951,121 B2* | 2/2015 | Lyons ............................. | 463/30 |
| 8,986,118 B2* | 3/2015 | Homer .................. | G06F 3/0488 463/12 |
| 9,317,110 B2* | 4/2016 | Lutnick .................... | G06F 3/011 |
| 9,345,973 B1* | 5/2016 | Antkowiak ........... | A63F 13/573 |
| 9,423,931 B2* | 8/2016 | Shimadate ............ | G06F 3/0483 |
| 2003/0112236 A1* | 6/2003 | Cordner ................ | G06F 3/0483 345/419 |
| 2006/0058093 A1* | 3/2006 | White ..................... | A63F 13/10 463/13 |
| 2007/0149283 A1* | 6/2007 | Poh ......................... | A63F 13/00 463/37 |

(Continued)

*Primary Examiner* — Steven J Hylinski
(74) *Attorney, Agent, or Firm* — CKC & Partners Co., Ltd.

(57) ABSTRACT

A gesture manipulation method and a gaming system are disclosed herein. The gesture manipulation method is suitable for an electronic apparatus including a touch sensor and means for displaying. The gesture manipulation method includes following steps. A gesture input is detected by the touch sensor when a visual card image is displayed on the means for displaying and the visual card image shows a back side of at least a playing card. When at least one contact point of the gesture input is detected to move along a specific pattern relative to the visual card image, a corresponding function is triggered or the visual card image is adjusted in response to the gesture input moved along the specific pattern.

11 Claims, 15 Drawing Sheets

(56) References Cited

U.S. PATENT DOCUMENTS

| | | | |
|---|---|---|---|
| 2008/0070661 A1* | 3/2008 | Au-Yeung | G07F 17/32 463/13 |
| 2008/0268932 A1* | 10/2008 | Nagano | G07F 17/3209 463/11 |
| 2009/0117995 A1* | 5/2009 | Lyons | G07F 17/3211 463/25 |
| 2009/0143141 A1* | 6/2009 | Wells | G07F 17/32 463/37 |
| 2009/0253503 A1* | 10/2009 | Krise | A63F 3/00 463/31 |
| 2009/0325691 A1* | 12/2009 | Loose | G07F 17/32 463/30 |
| 2010/0113140 A1* | 5/2010 | Kelly | G07F 17/32 463/25 |
| 2010/0120536 A1* | 5/2010 | Chatellier | G07F 17/3209 463/40 |
| 2012/0108337 A1* | 5/2012 | Kelly | G07F 17/3209 463/37 |
| 2012/0136892 A1* | 5/2012 | Ajima | G06F 17/30864 707/769 |
| 2013/0017877 A1* | 1/2013 | Dahl | G07F 17/326 463/16 |
| 2014/0087802 A1* | 3/2014 | Ventura | G07F 17/3244 463/13 |
| 2014/0094298 A1* | 4/2014 | Lyons | A63F 13/06 463/31 |

* cited by examiner

GAMING SYSTEM AND GESTURE MANIPULATION METHOD THEREOF

RELATED APPLICATIONS

This application claims priority to U.S. Provisional Patent Application Ser. No. 61/757,240, filed Jan. 28, 2013, which is herein incorporated by reference.

BACKGROUND

Field of Disclosure

The present disclosure relates to an interactive entertainment systems. More particularly, the present disclosure relates to a user interface and a gaming system of electronic video card games.

Description of Related Art

Poker games or card games are always popular choice for entertainment. Recently, the development of the Internet has given rise to many online versions of these games. The Internet has allowed people around the world to join the same game remotely. The popularity of online poker has led to a significant rise in popular interest for all kinds of card games. For example, one of the most popular poker games is Texas Hold'em (or known as Texas Poker). Texas Hold'em is offered by many online poker websites. Texas Hold'em even has some live-broadcasting for some important games or competitions.

Online poker has various improvements over the traditional card game, such as portability, anti-cheating measures, automated betting and prize distribution and remote access for players. However, a wireless internet connection is necessary for playing online pokers, but the quality of the wireless internet connection on user's device is not always stable, and the wireless connection will charge extra fee to player. In addition, playing card games face-to-face is a good activity to do during gathering with friend. People will not prefer to play on-line poker games when they are sitting together.

SUMMARY

Therefore, the disclosure provides a gaming system, which is a computer implementation of card games. The mobile devices of the gaming system can form a communicative connection between each others without connecting to an on-line central server. Furthermore, the disclosure provides a gesture manipulation method, such that a player can intuitively manipulate/play cards or chips with specific gestures sensed by a touch sensor. Therefore, the gesture manipulation method can provide an intuitive user experience similar to playing traditional cards instead of manipulating machines.

An embodiment of the disclosure provides a gesture manipulation method, which is suitable for an electronic apparatus including a touch sensor and means for displaying. The gesture manipulation method includes following steps. A gesture input is detected by the touch sensor when a visual card image is displayed the means for displaying and the visual card image shows a back side of at least a playing card. When at least one contact point of the gesture input is detected to move along a specific pattern relative to the visual card image, a corresponding function is triggered or the visual card image is adjusted in response to the gesture input moved along the specific pattern.

Another embodiment of the disclosure provides a gesture manipulation method suitable for an electronic apparatus comprising a touch sensor and means for displaying. The gesture manipulation method includes following steps. A gesture input is detected by the touch sensor when a visual chip image is displayed on the means for displaying and the visual chip image includes a first portion and a second portion. When a contact point of the gesture input is detected to slide within the first portion, a betting value is dynamically regulated according a relative position of the contact point within the first portion It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
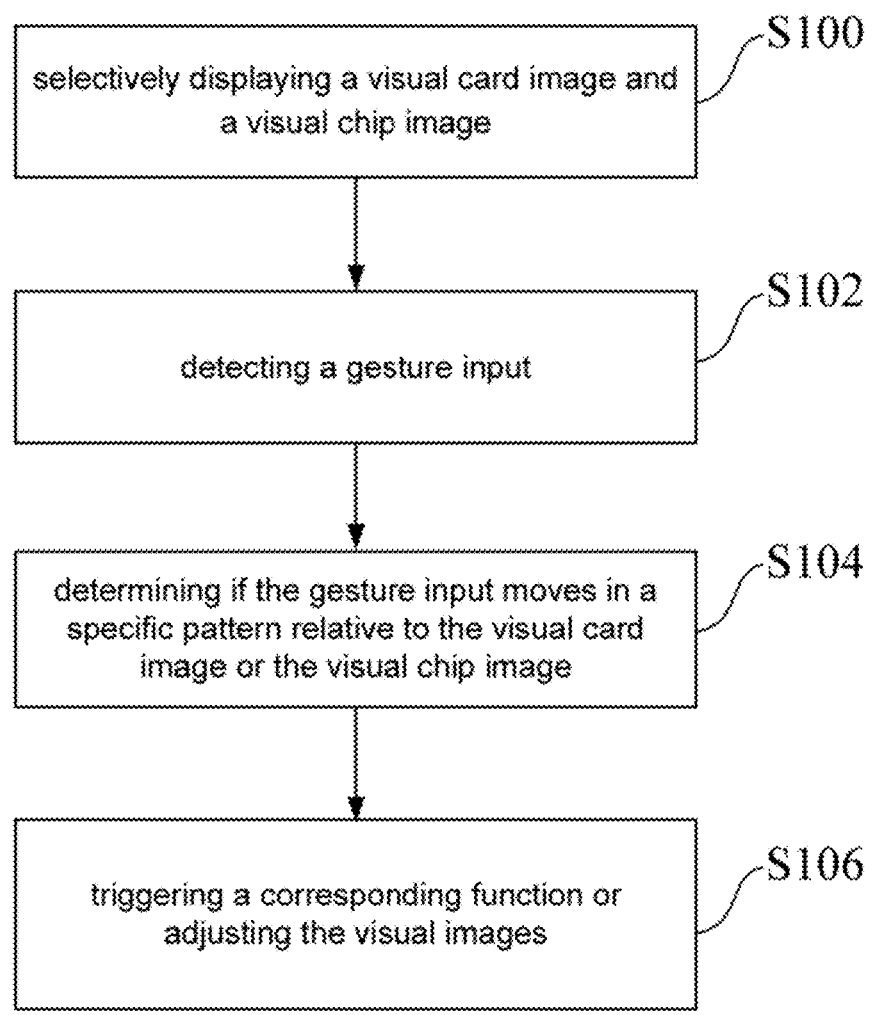
FIG. 1 is a schematic diagram illustrating flow charts of a gesture manipulation method according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
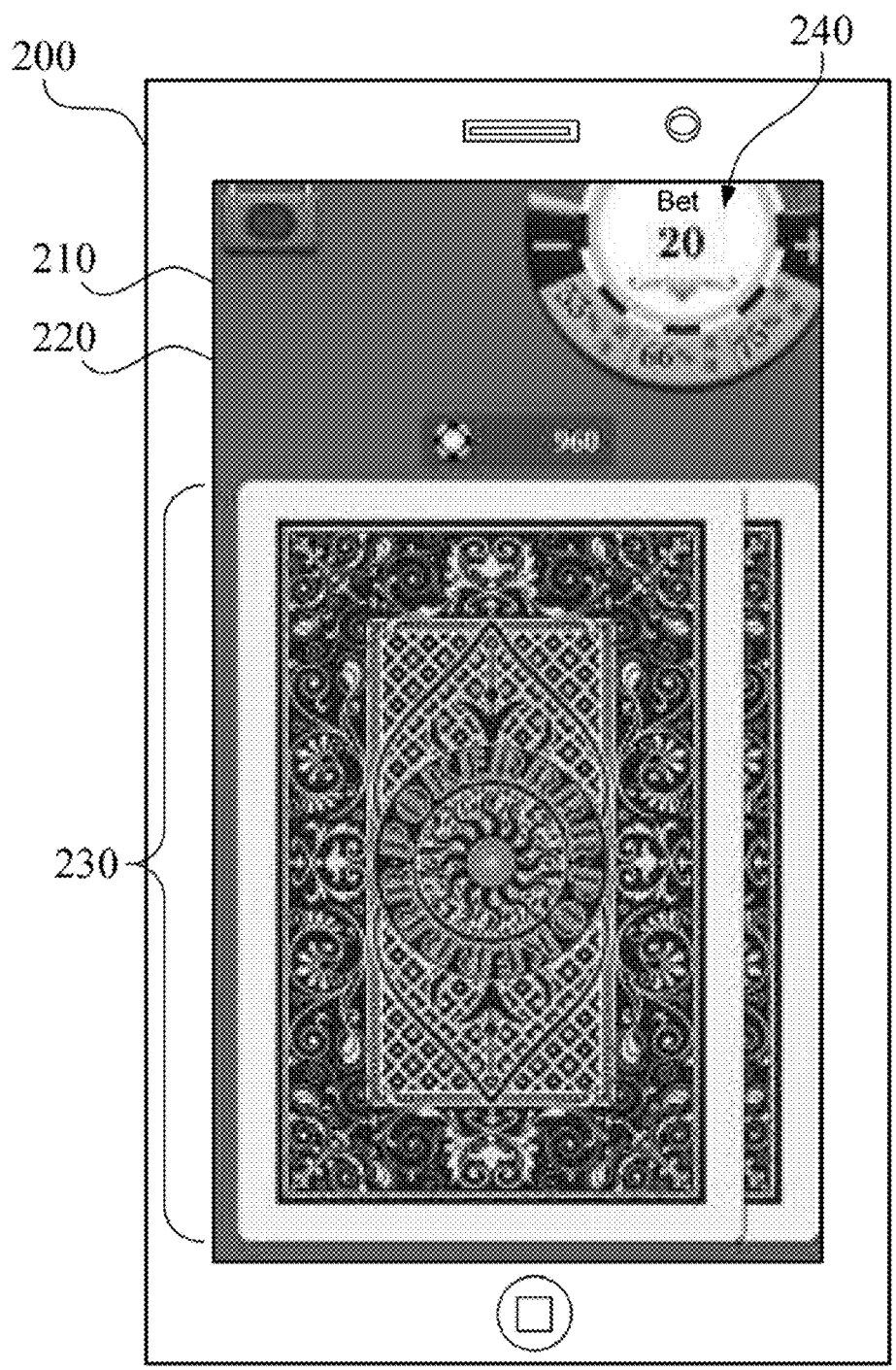
FIG. 2 is a schematic diagram illustrating an electronic apparatus according to an embodiment of the disclosure.

Reference is made to FIG. 1, which is a schematic diagram illustrating flow charts of a gesture manipulation method 100 according to an embodiment of the disclosure. The gesture manipulation method 100 is suitable for an electronic apparatus for providing a computer implementation of card games. In some embodiments, the electronic apparatus can be a mobile phone, a smartphone, a tablet computer, a laptop computer, a personal computer, a portable network device (PND) or any equivalent device. Reference is also made to FIG. 2, which is a schematic diagram illustrating an electronic apparatus 200 according to an embodiment of the disclosure. In this embodiment, the electronic apparatus 200 is equipped with a display panel 210 and a touch sensor 220 integrated with the display panel 210.

As shown in FIG. 1 and FIG. 2, the gesture manipulation method 100 performs operation S100 for selectively displaying a visual card image 230 and a visual chip image 240 on the display panel 210. In following embodiments, the gesture manipulation method is demonstrated with an example corresponding to the card game "Texas Hold'em". However, the gesture manipulation method is not merely limited to "Texas Hold'em". It can be utilized in any equivalent card game. It is noted that, the visual card image 230 in this example shows back sides of two playing cards, but the card amount is not limited to two (can be different in other card games). In the embodiment, the visual chip image 240 can be dragged and placed at different position on the display panel 210. In some embodiment, the visual chip image 240 can be temporally hided when it is not a betting time for the current user, and can be shown again when it is the betting time for the current user.

The gesture manipulation method 100 performs operation S102 for detecting a gesture input from user (e.g., a contact by user's fingers or a stylus manipulated by user) by the touch sensor 220. Afterward, the gesture manipulation method 100 performs operation S104 for determining if the gesture input moves in a specific pattern relative to the visual card image 230 or the visual chip image 240. Accordingly, the gesture manipulation method 100 performs operation S106 for triggering a corresponding function (e.g., playing corresponding animations, activating a function of peeking-cards, folding cards, check-announcement, betting, calling or raising) or adjusting the visual images (the visual card image 230 or the visual chip image 240) in response to the gesture input moved along the specific pattern. The details of the patterns of the gesture input and corresponding interactions are disclosed in following paragraphs.

Figure 3:
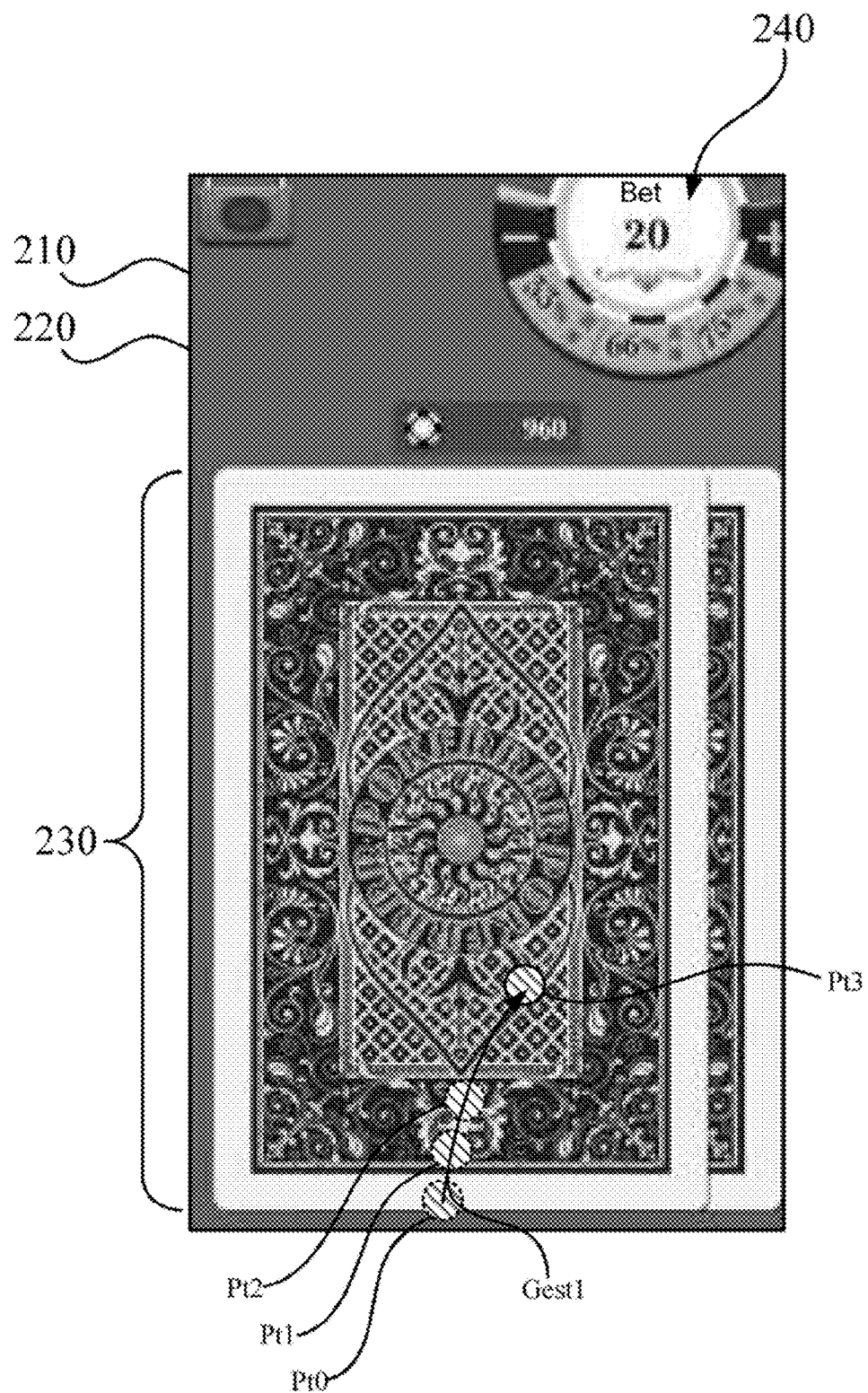
FIG. 3 is a schematic diagram illustrating a gesture input according to an embodiment of the disclosure.
Figure 4A:
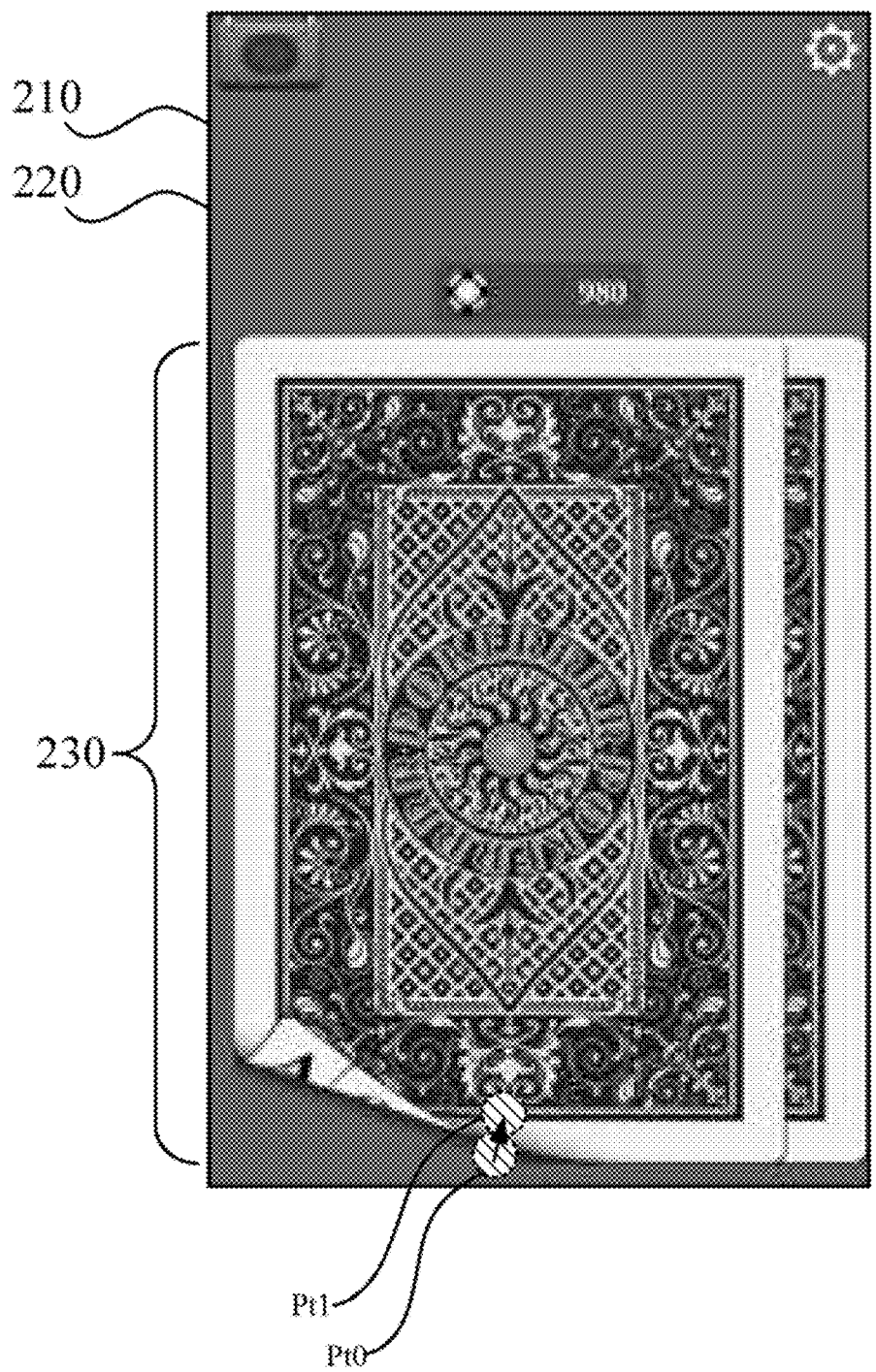
FIG. 4A to FIG. 4C are schematic diagram illustrating the partially revealed playing cards of the visual card image during the gesture input.
Figure 4B:
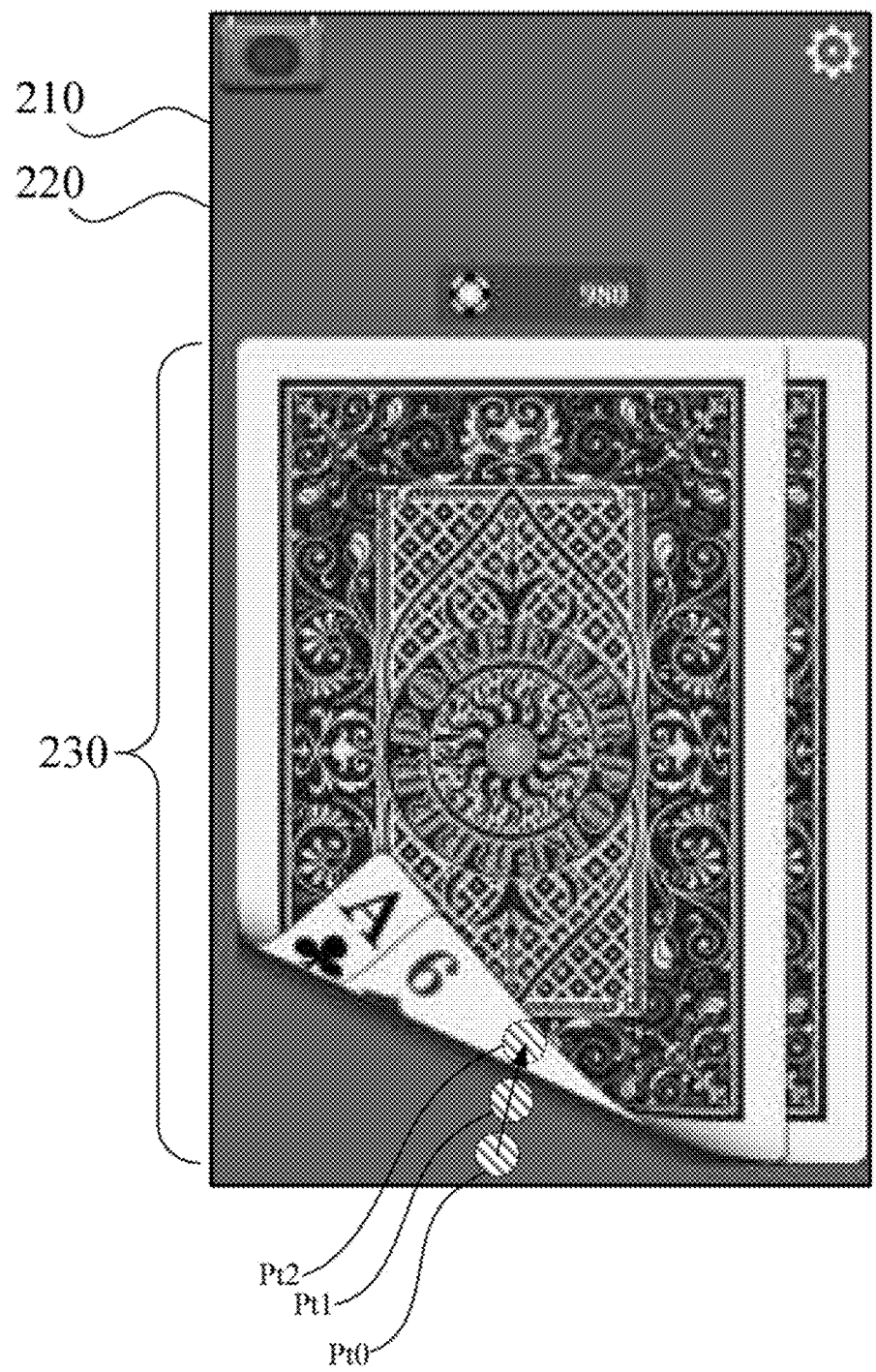
Figure 4C:
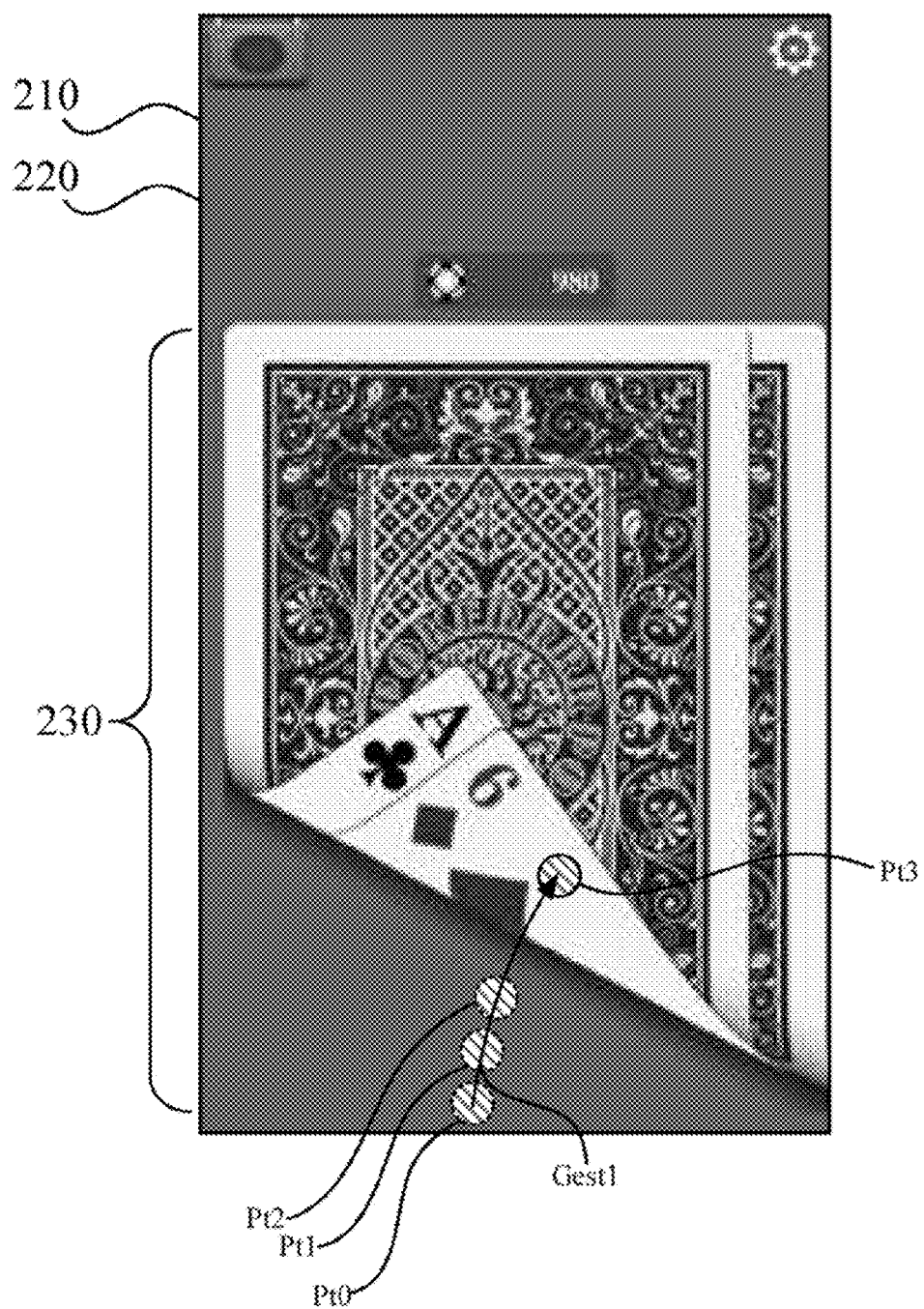

Reference is made to FIG. 3, which is a schematic diagram illustrating a gesture input Gest1 according to an embodiment of the disclosure. While the card game is processing, if the user tends to perform a peeking-cards action (i.e., in conventional card games, a player may flip a corner of card for peeking what he has in his hand), the user can perform a touch on the touch panel (i.e., the display panel 210 integrated with the touch sensor 220) starting at a side of the visual card image 230, sliding inward to a center of the visual card image 230 and holding at a holding position. Accordingly, at least one contact point of the gesture input Gest1 is detected to move relatively from a side toward a center of the visual card image 230 and stop at a holding position Pt3. In this case, the visual card image 230 is adjusted to partially reveal a front side of the playing card according to the gesture input Gest1. Reference is made to FIG. 4A to FIG. 4C, which are schematic diagram illustrating the partially revealed playing cards of the visual card image 230 during the gesture input Gest1.

When the contact point is detected to move from the side toward the center of the visual card image 230, the visual card image 230 is adjusted to simulate that corners of the playing cards are flipped for peeking. In order to achieve better simulation to peeking-cards, revealed proportions of the front sides of the playing cards are positively correlated to a movement distance of the contact point. As shown in FIG. 4A, the contact point is moved by a short distance from the position Pt0 to the position Pt1, and the visual card image 230 only reveals relative love proportions of the front sides of the playing cards. As shown in FIG. 4B, the contact point is moved by a longer distance (relative to FIG. 4A) from the position Pt0 to the position Pt2, and the visual card image 230 reveals a little more of the front sides. As shown in FIG. 4C, the contact point is moved by the longest distance (relative to FIG. 4A and FIG. 4B) from the position Pt0 to the position Pt3, and the visual card image 230 reveals the most of the front sides, such that user can easily distinguish what the playing cards are. In addition, the revealed front side is dynamically refreshed according to coordinates of the holding position Pt3.

Figure 5:
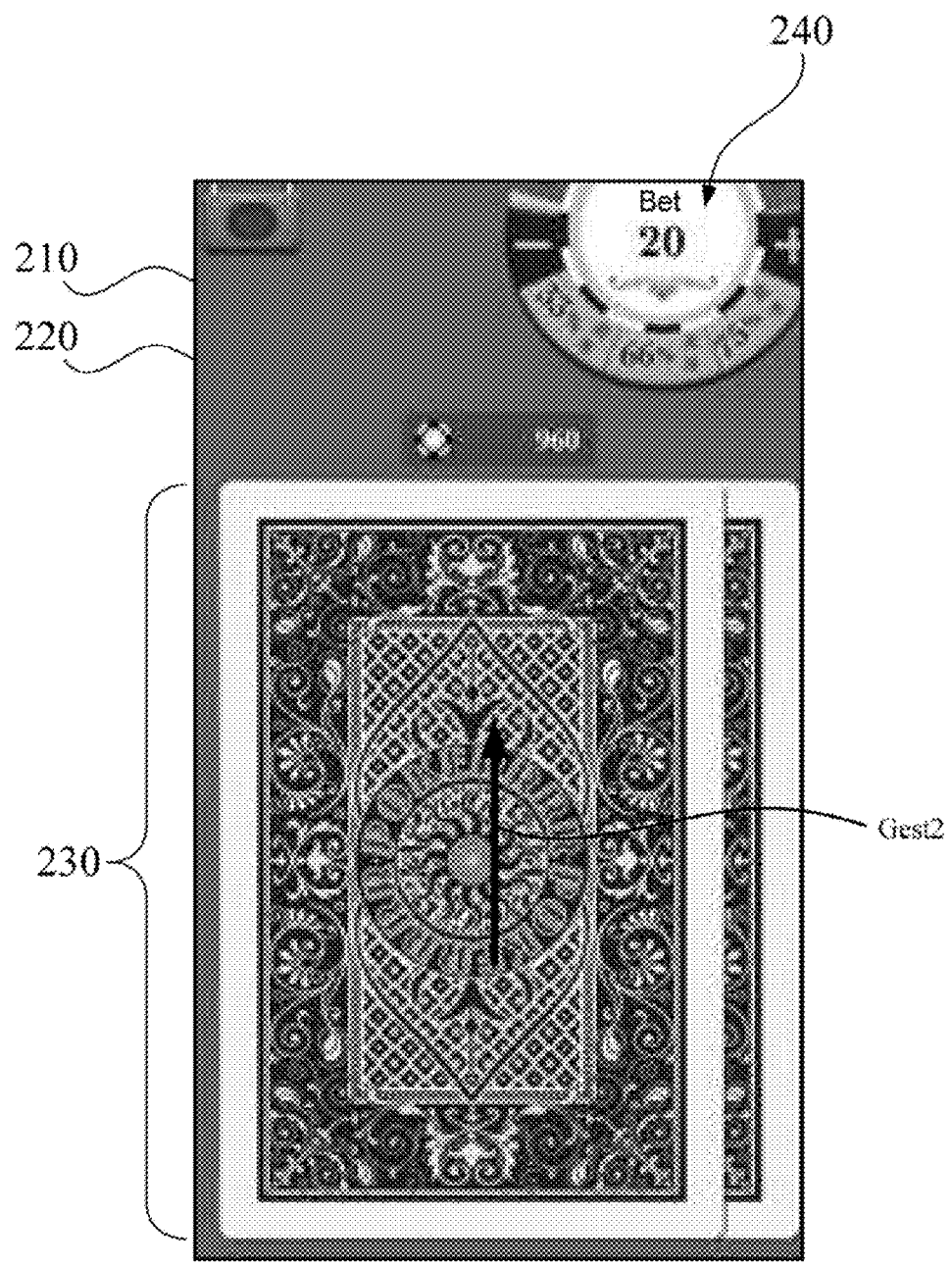
FIG. 5 is a schematic diagram illustrating another gesture input according to an embodiment of the disclosure.

Reference is made to FIG. 5, which is a schematic diagram illustrating another gesture input Gest2 according to an embodiment of the disclosure. While the card game is processing, if the user tends to perform a folding-cards action (i.e. in conventional card games, folding-cards is to drop out of the hand losing any bets they have already made), the user can perform a touch on the touch panel (i.e., the display panel 210 integrated with the touch sensor 220) starting at a point on the visual card image 230, sliding forward and releasing. Accordingly, at least one contact point of the gesture input Gest2 is detected to slide forward relatively over the display panel, an instruction of folding action is triggered by the gesture manipulation method 100. In this case, the user can declare folding-card by touching on the visual card image 230 and sliding forward, so as to discard his hand and forfeit interest in the current pot. No further bets are required by the folding player.

Figure 6:
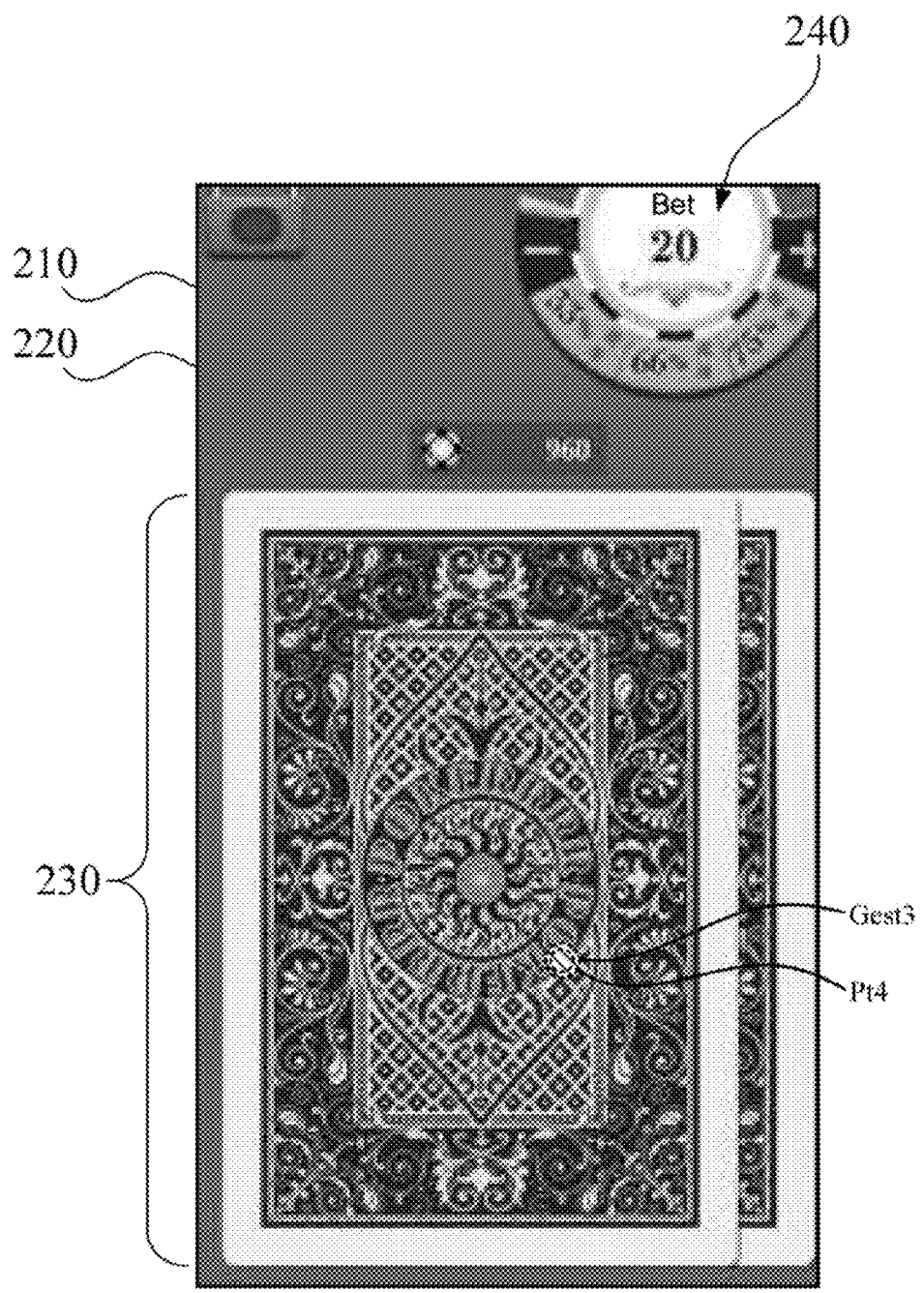
FIG. 6 is a schematic diagram illustrating another gesture input according to an embodiment of the disclosure.

Reference is made to FIG. 6, which is a schematic diagram illustrating another gesture input Gest3 according to an embodiment of the disclosure. While the card game is processing, if no one has yet opened the betting round, a player may pass or check, which is equivalent to betting zero and/or to calling the current bet of zero. When checking, a player declines to make a bet; this indicates that he does not wish to open, but does wish to keep his cards and retain the right to call or raise later in the same round if an opponent opens. If the user tends to perform a checking action, the user can perform a touch on the touch panel (i.e., the display panel 210 integrated with the touch sensor 220) with double clicks or double taps at a point on the visual card image 230. Accordingly, sequential taps of the gesture input Gest3 is detected within a range (e.g., at the position Pt4 or a range around the position Pt4) of the visual card image 230, an instruction of checking action is triggered by the gesture manipulation method 100.

Figure 7:
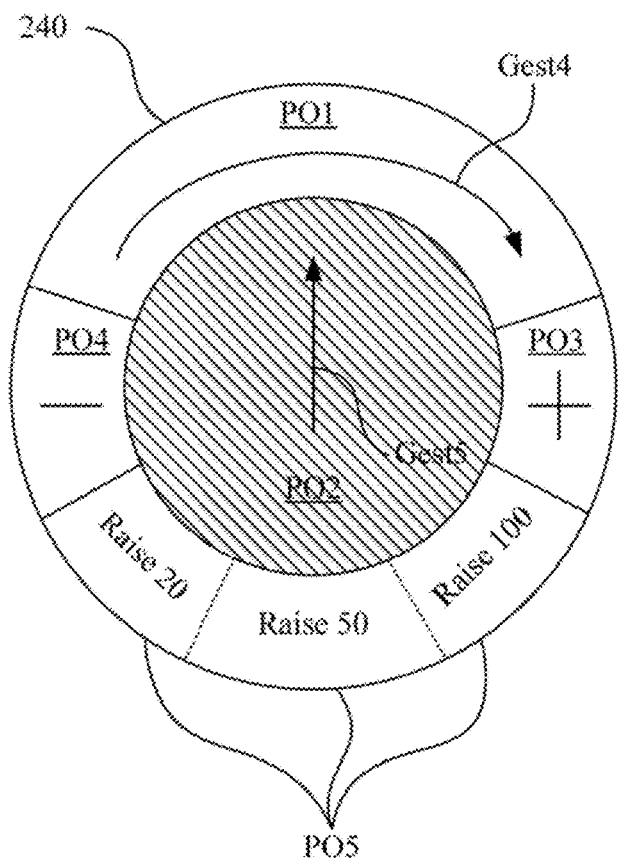
FIG. 7 is a schematic diagram illustrating more detail of the visual chip image according to embodiments of this disclosure.

Reference is made to FIG. 7, which is a schematic diagram illustrating more detail of the visual chip image 240 according to embodiments of this disclosure. In the embodiment shown in FIG. 7, the visual chip image includes five portions PO1~PO5. A first portion PO1 is a scroll track. A second portion PO2 is a confirmation area, which is operated to confirm a betting amount.

While the card game is processing, if in any betting round it is a player's turn to act and the action is unopened, then the player can open action in a betting round by making a bet. To raise is to increase the size an existing bet in the same betting round. To raise is to increase the size an existing bet in the same betting round. To call is to match a bet or match a raise. In other words, player can perform actions of betting/raising/calling related to the betting value.

If the user tends to perform a betting/raising/calling action, the user has to decide how much he would like to bet at first. In the embodiment, the user can regulate his bet by manipulating on the first portion PO1 (i.e., the scroll track) of the visual chip image 240. If a contact point of the gesture input Gest4 is detected to slide within the first portion PO1, dynamically regulating a betting value according to a relative position of the contact point within the first portion PO1 by the gesture manipulation method 100. For example, when the gesture input Gest4 slides deep to the right side (clockwise), the betting value is increased accordingly. For example, when the gesture input Gest4 slides to the left side (counter-clockwise), the betting value is reduced accordingly. In other words, the betting value is raised proportionally or reduced proportionally according to the relative holding position of the gesture input Gest4 within the scroll track.

In addition, when the contact point of the gesture input (not shown) is detected to click within the third portion PO3, the gesture manipulation method 100 raises the betting value by a fixed amount (e.g., 1, 5, 10, or any fixed amount). When the contact point of the gesture input (not shown) is detected to click within the fourth portion PO4, the gesture manipulation method 100 reduces the betting value by a fixed amount.

In the embodiment, there are three columns of the fifth portion PO5, and each column represents a predetermined value of the betting value. The predetermined values are 20, 50 and 100 in this embodiment, but the disclosure is not limited to these values. When the contact point of the gesture input (not shown) is detected to click within the fifth portion PO5, setting the betting value to one of the predetermined values accordingly.

Figure 8A:
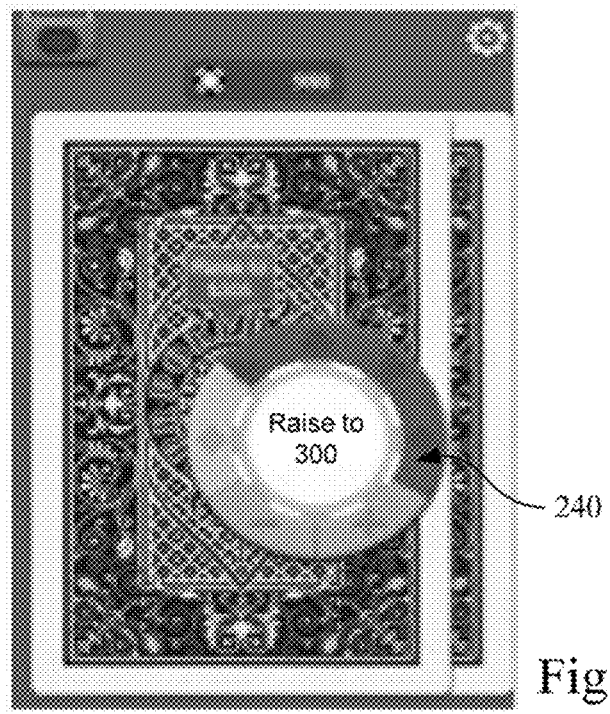
FIG. 8A and FIG. 8B are schematic diagrams illustrating different amounts of the chips in the stack.
Figure 8B:
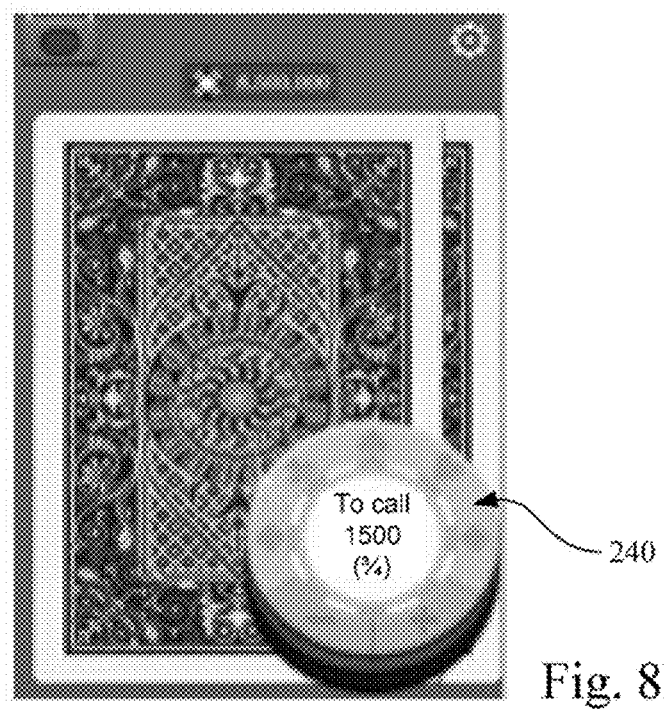

In addition, the visual chip image 240 includes plural chips stacking together. While the user regulating the betting value, an amount of the chips in the stack will be changed dynamically in this embodiment. Reference is made to FIG. 8A and FIG. 8B, which are schematic diagrams illustrating different amounts of the chips in the stack. FIG. 8A illustrates the visual chip image 240 with a lower betting value. FIG. 8B illustrates the visual chip image 240 with a higher betting value. The amount of the chips in FIG. 8B is more than the amount of the chips in FIG. 8A.

After the user decided the betting value by manipulating portions PO1 and/or PO2~PO5, the user can perform a betting/raising/calling action by touching on the second portion PO2 and sliding forward (i.e., the gesture input Gest5), which is similar to pushing chips forward. When the contact point of the gesture input Gest5 is detected to slide forward from the second portion PO2, the gesture manipulation method 100 acknowledges that a betting number is confirmed.

Figure 8C:
FIG. 8C is a schematic diagram illustrating the animation in which the stack of chips is slide forward.

When the betting number is confirmed, an animation is displayed on the display panel 210 by the gesture manipulation method 100. In the animation, a stack of chips is slidden forward, and an amount of the chips in the animation is varied according to the betting number. Reference is made to FIG. 8C, which is a schematic diagram illustrating the animation in which the stack of chips is slide forward.

Figure 9A:
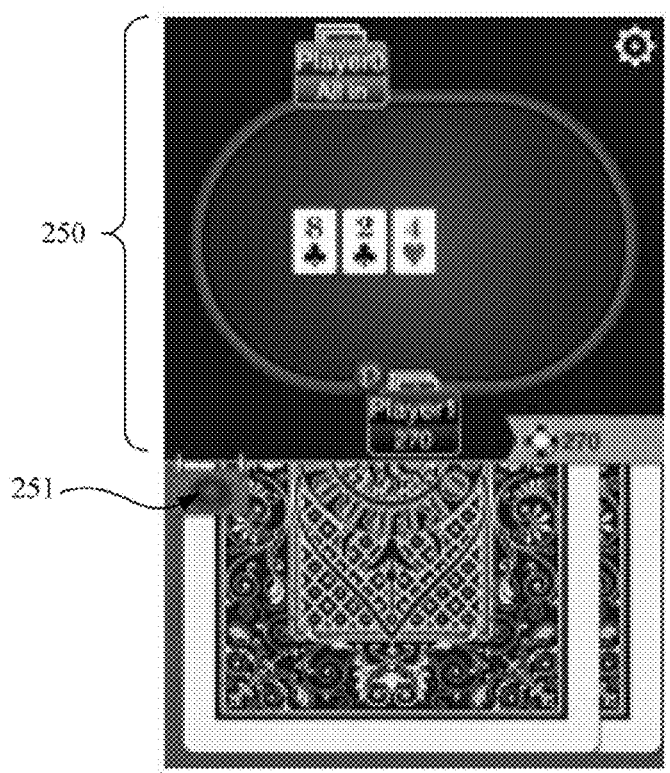
FIG. 9A and FIG. 9B are schematic diagrams illustrating a foldable gaming table on the display panel.
Figure 9B:
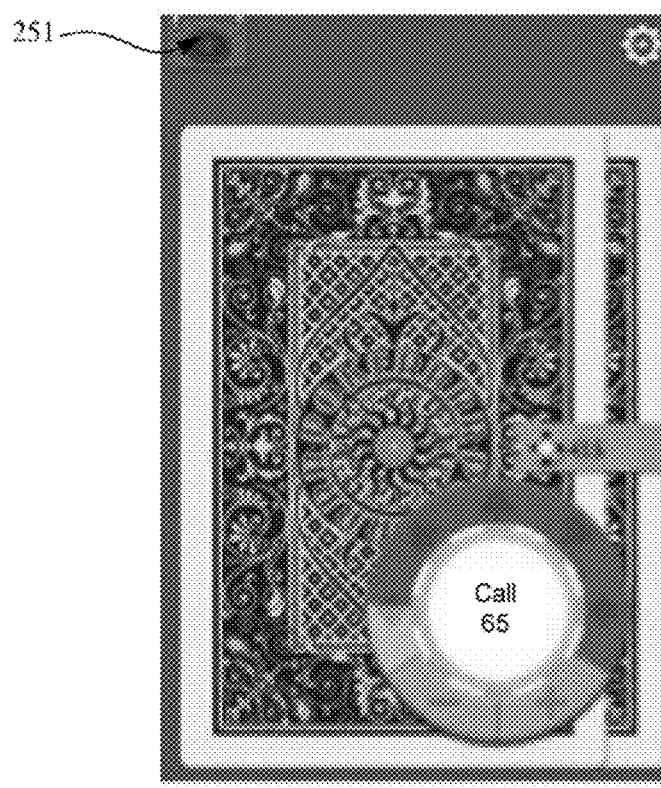

Reference is made to FIG. 9A and FIG. 9b, which are schematic diagrams illustrating a foldable gaming table 250 on the display panel 210. In order to display states of other players in the same time, the foldable gaming table 250 can be displayed on the display panel 210 by the gesture manipulation method 100. The user can clicks on a switch button 251 to reveal (as shown in FIG. 9A) or hide (as shown in FIG. 9b) the foldable gaming table 250 selectively.

Figure 10:
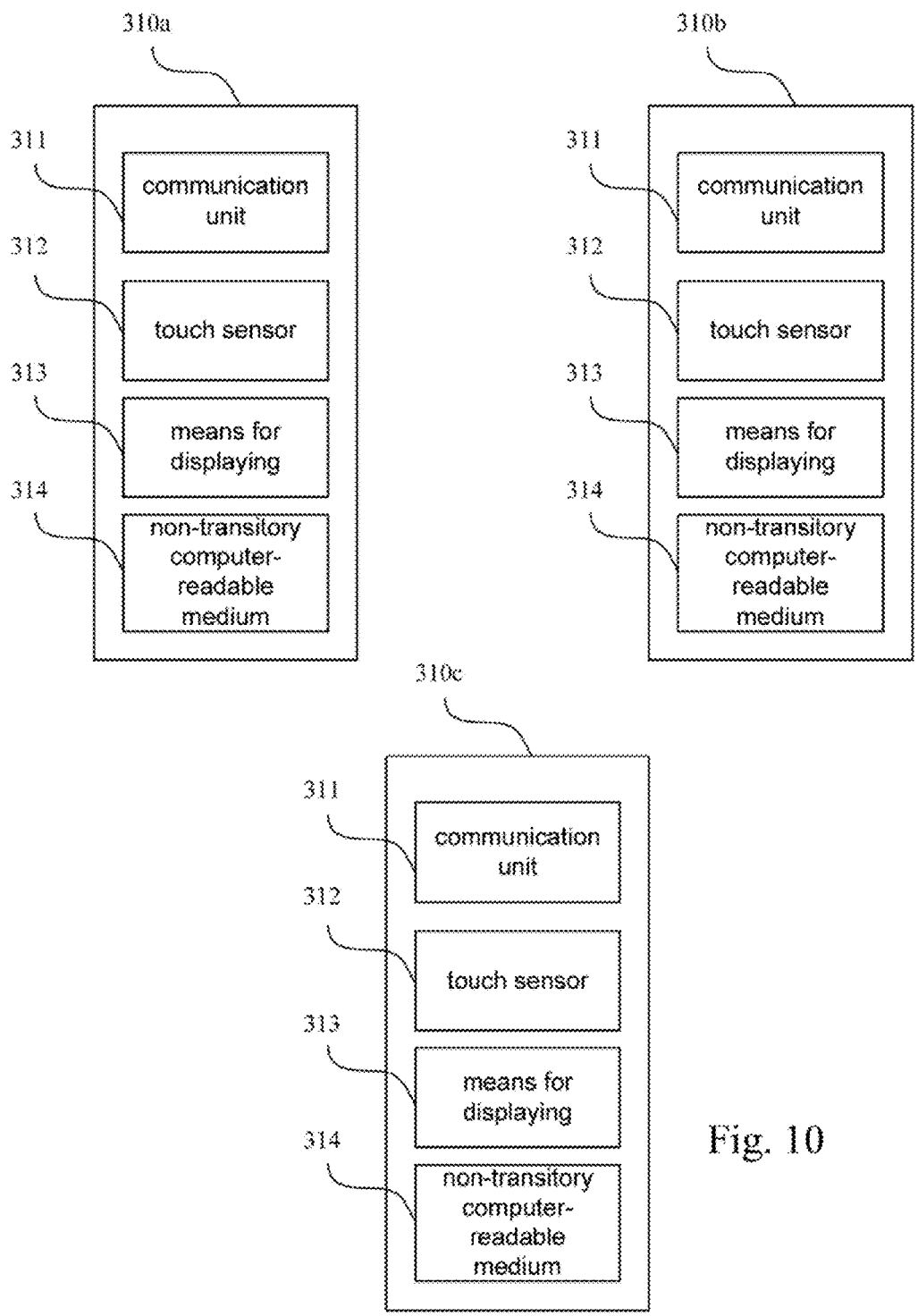
FIG. 10 is a schematic diagram illustrating a gaming system according to an embodiment of the disclosure.

Reference is made to FIG. 10 which is a schematic diagram illustrating a gaming system 300 according to an embodiment of the disclosure. As shown in FIG. 10, the gaming system 300 includes electronic apparatuses 310a~310c. Each of the electronic apparatuses 310a~310c includes a communication unit 311, a touch sensor 312, a display panel 313 and a non-transitory computer-readable medium 314. In the embodiment, each of the electronic apparatuses 310 can be referred to the electronic apparatus 200 shown in aforesaid embodiments. The electronic apparatuses 310a~310c forming a communicative network between each others via their communication units 311. In some embodiments, the communication unit 311 can be a local communication unit (e.g., Bluetooth, Zigbee, RFID, etc), but the disclosure is not limited to this. The non-transitory computer-readable medium 314 has computer-executable instructions for performing the gesture manipulation method 100 in aforesaid embodiments.

Figure 11A:
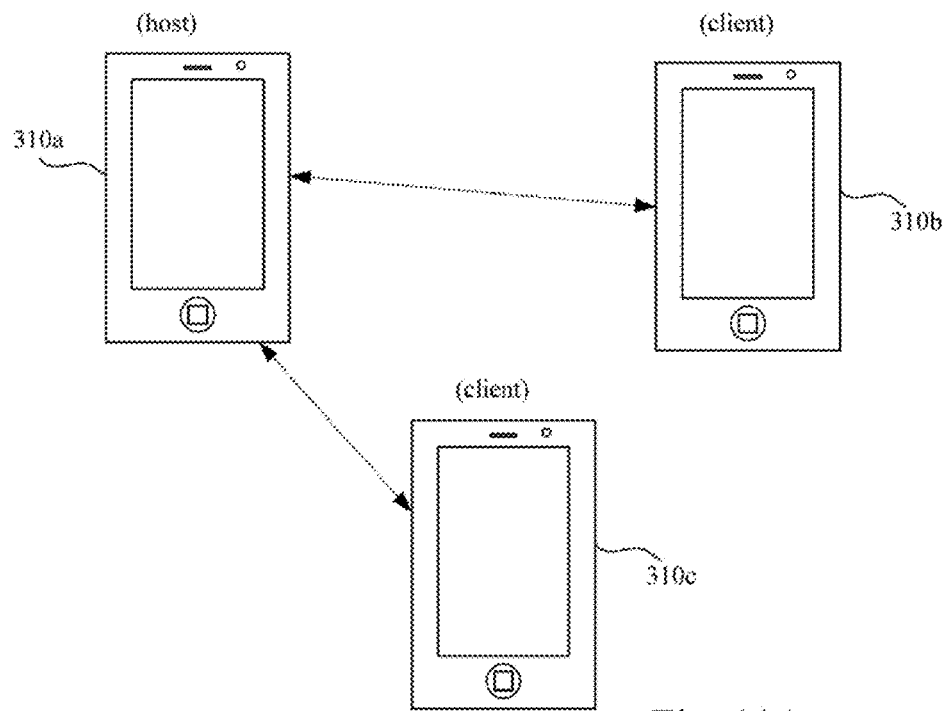
FIG. 11A and FIG. 11B are schematic diagrams illustrating two example of the electronic apparatuses in the gaming system.
Figure 11B:
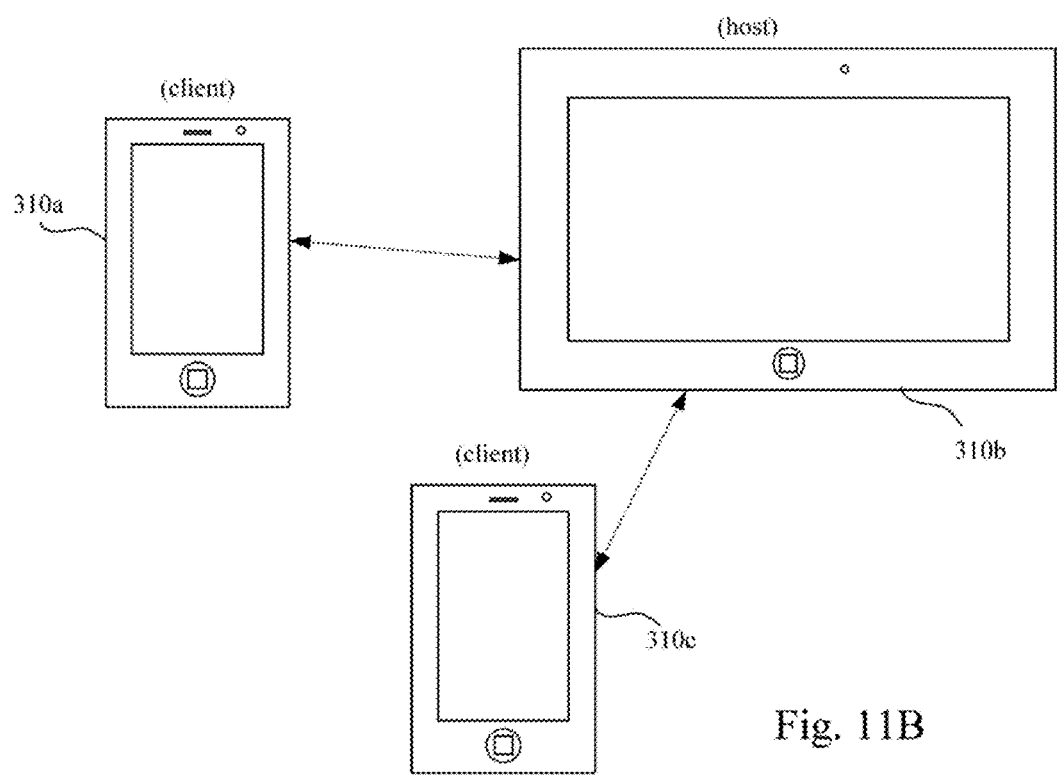

Reference is made to FIG. 11A and FIG. 11B, which are schematic diagrams illustrating two example of the electronic apparatuses 310a~310c in the gaming system 300. In the example shown in FIG. 11A, all of the electronic apparatuses 310a~310c are mobile devices with similar-sized display panels. In this case, any one of the mobile devices can be selected to serve as a host. In this case, the electronic apparatus 310a is selected as the host. The electronic apparatuses 310b and 310b are selected as clients and respectively form a communicative connection to the host. In this case of FIG. 11A, a foldable gaming table is selectively displayed on the display panels of the mobile devices (referring to embodiments of FIG. 9A and FIG. 9B).

In the example shown in FIG. 11B, the electronic apparatuses 310a~310c includes first mobile devices (e.g., the electronic apparatuses 310a and 310c are smartphones) and a second mobile device (e.g., the electronic apparatus 310b is a tablet computer). Each of the first mobile devices and the second mobile device equips means for displaying. The display means of the mobile device include a LCD display panel, an AMOLED display panel, a CRT monitor, a projecting module, or any equivalent display unit.

In this embodiment, the first mobile devices (310a and 310c) equip with display panels, and the second mobile device (310b) equips with a display panel. In some examples, the first mobile devices (310a and 310c) equip with similar-sized display panels, and the second mobile device (310b) equips with a relatively larger-sized display panel, but the disclosure is not limited to this. In the example, the electronic apparatus 310b serves as a host, and the electronic apparatuses 310a and 310c serve as clients and respectively form a communicative connection to the host.

In this case, a foldable gaming table is displayed on each of the display panels of the electronic apparatuses 310a and 310c in the gaming system 300. A gaming table is displayed on the display panel of the electronic apparatuses 310b with the relatively larger-sized display panel.

Figure 12:
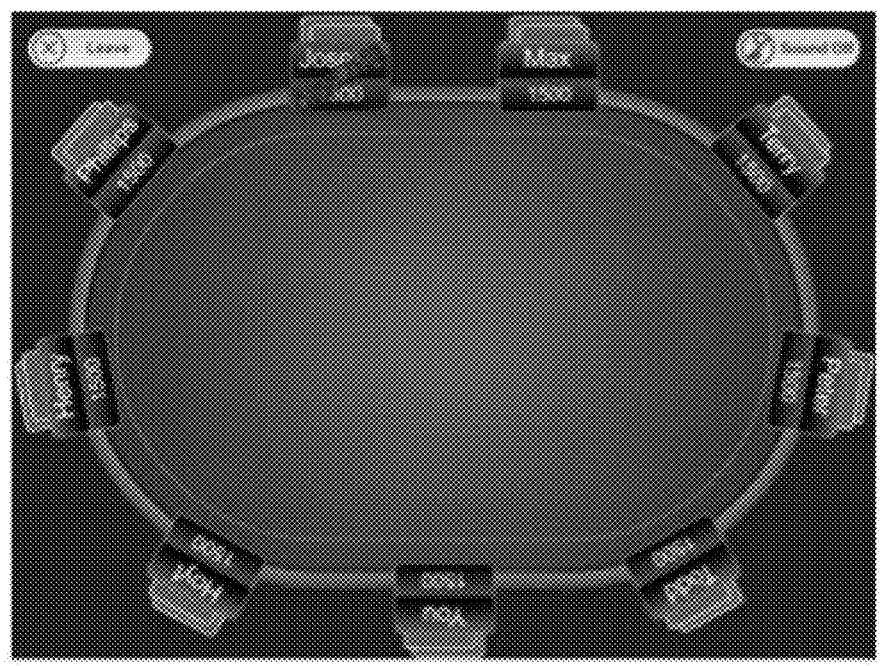
FIG. 12 is a schematic diagram illustrating the gaming table displayed on the electronic apparatuses.

Reference is made to FIG. 12, which is a schematic diagram illustrating the gaming table displayed on the electronic apparatuses 310b. As shown in FIG. 12, player-icons IC1~IC8 from each of the first mobile devices (representing different players) are displayed around the gaming table on the display panel of the second mobile device. Each of the player-icons IC1~IC8 is displayed in each direction toward a center of the gaming table The gesture manipulation method and the method executed by the computer-executable instructions may take the form of a computer program product stored on a computer-readable storage medium having computer-readable instructions embodied in the medium. Any suitable storage medium (such as non-transitory medium) may be used including non-volatile memory such as read only memory (ROM), programmable read only memory (PROM), erasable programmable read only memory (EPROM), and electrically erasable programmable read only memory (EEPROM) devices; volatile memory such as static random access memory (SRAM), dynamic random access memory (DRAM), and double data rate random access memory (DDR-RAM); optical storage devices such as compact disc read only memories (CD-ROMs) and digital versatile disc read only memories (DVD-ROMs); and magnetic storage devices such as hard disk drives (HDD) and floppy disk drives.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A gesture manipulation method, suitable for an electronic apparatus comprising a touch sensor and a display panel, the gesture manipulation method comprising:
   detecting a gesture input by the touch sensor when a visual chip image is displayed on the display panel and the visual chip image comprises a first portion, a second portion, a third portion and a fourth portion on a same surface of a top-most chip of the visual chip image;
   when the contact point of the gesture input is detected to click within the third portion, raising the betting value by a fixed amount; and when the contact point of the gesture input is detected to click within the fourth portion, reducing the betting value by the fixed amount;
   when a contact point of the gesture input is detected to slide within the first portion, dynamically regulating a betting value according to a relative position of the contact point within the first portion;
   when the at least one contact point of the gesture input is sequentially detected to touch on, slide forward and release relatively over the display panel, an instruction a of folding action is triggered to discard a one or more cards held by a player to fold a hand.

2. The gesture manipulation method of claim 1, further comprising:
   confirming a betting number when the contact point of the gesture input is detected to slide forward from the second portion.

3. The gesture manipulation method of claim 2, further comprising:
   when the betting number is confirmed, displaying an animation in which a stack of chips is slidden forward, and an amount of the chips in the animation is varied according to the betting number.

4. The gesture manipulation method of claim 1, wherein the first portion is a scroll track, the betting value is raised proportionally or reduced proportionally according to the relative position within the scroll track.

5. The gesture manipulation method of claim 1, wherein the visual chip image further comprises a fifth portion, the gesture manipulation method further comprises:
   when the contact point of the gesture input is detected to click within the fifth portion, setting the betting value to a predetermined value.

6. A gaming system, comprising:
   a plurality of electronic apparatuses, each of the electronic apparatuses comprising a communication unit, a touch sensor, a means for displaying and a non-transitory computer-readable medium, the electronic apparatuses forming a communicative network between each others via their communication units, the non-transitory computer-readable medium having computer-executable instructions configured to perform a method comprising:
   detecting a gesture input by the touch sensor when a visual card image is displayed on the means for displaying and the visual card image shows a back side of at least a playing card; and
   when at least one contact point of the gesture input is detected to move along a specific pattern relative to the visual card image, triggering a corresponding function or adjusting the visual card image in response to the gesture input moved along the specific pattern;
   detecting the gesture input by the touch sensor when a visual chip image is displayed along with the visual card image on the means for displaying and the visual chip image comprises a first portion, a second portion, a third portion and a fourth portion on a same surface of a top-most chip of the visual chip image;
   when the contact point of the gesture input is detected to click within the third portion, raising the betting value by a fixed amount; and when the contact point of the gesture input is detected to click within the fourth portion, reducing the betting value by the fixed amount;
   when a contact point of the gesture input is detected to slide within the first portion, dynamically regulating a betting value according to a relative position of the contact point within the first portion;
   when the at least one contact point of the gesture input is sequentially detected to touch on, slide forward and release relatively over the display panel, an instruction a of folding action is triggered to discard a one or more cards held by a player to fold a hand.

7. The gaming system of claim 6, wherein the electronic apparatuses comprises mobile devices with essentially same-sized means for displaying, one of the mobile devices serves as a host, and others of the mobile devices serve as clients and respectively form a communicative connection to the host.

8. The gaming system of claim 7, wherein the method further comprising:
  selectively displaying a foldable gaming table on the means for displaying of the mobile devices.

9. The gaming system of claim 6, wherein the electronic apparatuses comprises first mobile devices and a second mobile device, the first mobile devices equipped with means for displaying, the second mobile device equipped with a relatively larger-sized means for displaying, the second mobile device serves as a host, and the first mobile devices serve as clients and respectively form a communicative connection to the host.

10. The gaming system of claim 9, wherein the method further comprising:
  selectively displaying a foldable gaming table on the means for displaying of the first mobile devices; and
  displaying a gaming table on the means for displaying of the second mobile device.

11. The gaming system of claim 10, wherein the method further comprising:
  displaying player-icons from each of the first mobile devices around the gaming table on the means for displaying of the second mobile device, and each of the player-icons is displayed in each direction toward a center of the gaming table.

\* \* \* \* \*